(12) United States Patent
Tsai et al.

(10) Patent No.: US 6,831,016 B2
(45) Date of Patent: Dec. 14, 2004

(54) METHOD TO PREVENT ELECTRICAL SHORTS BETWEEN ADJACENT METAL LINES

(75) Inventors: Tzu-Ching Tsai, Taichung Hsien (TW); Ping Hsu, Chung-Ho (TW)

(73) Assignee: Nanya Technology Corporation, Taoyuan (TW)

( * ) Notice: Subject to any disclaimer, the term of this patent is extended or adjusted under 35 U.S.C. 154(b) by 125 days.

(21) Appl. No.: 10/153,347

(22) Filed: May 21, 2002

(65) Prior Publication Data
US 2003/0045108 A1 Mar. 6, 2003

(30) Foreign Application Priority Data
Sep. 4, 2001 (TW) .......................... 90121878 A

(51) Int. Cl.$^7$ .......................................... H01L 21/302
(52) U.S. Cl. ........................ 438/692; 438/700; 438/720
(58) Field of Search ................... 438/700, 692, 438/693, 706, 712, 714, 720

(56) References Cited

U.S. PATENT DOCUMENTS

| | | | | |
|---|---|---|---|---|
| 5,326,427 A | * | 7/1994 | Jerbic ......................... 156/643 |
| 6,004,884 A | * | 12/1999 | Abraham ..................... 438/714 |
| 6,043,146 A | * | 3/2000 | Watanabe et al. ............ 438/623 |
| 6,218,255 B1 | * | 4/2001 | Fritzinger et al. ........... 438/386 |
| 6,380,069 B1 | * | 4/2002 | Chen et al. .................. 438/633 |
| 6,395,607 B1 | * | 5/2002 | Chung .......................... 438/312 |
| 6,404,055 B1 | * | 6/2002 | Jeon et al. .................... 257/752 |
| 6,561,883 B1 | * | 5/2003 | Kondo et al. ................. 451/63 |

* cited by examiner

Primary Examiner—Kin-Chan Chen
(74) Attorney, Agent, or Firm—Ladas & Parry

(57) ABSTRACT

A method to prevent electrical shorts between adjacent metal lines on a semiconductor substrate having an insulating layer with a pair of damascene structures connecting to the semiconductor substrate and a scratch on the upper surface of the insulating layer, between the damascene structures, is provided. A diffusion barrier layer is deposited on the damascene structures and the scratch. Then, a metal layer is formed to fill the damascene structures. Next, the metal is chemical-mechanically polished to form a metal line. Finally, the diffusion barrier layer disposed on the surface of the scratch is removed by etching process.

7 Claims, 5 Drawing Sheets

METHOD TO PREVENT ELECTRICAL SHORTS BETWEEN ADJACENT METAL LINES

BACKGROUND OF THE INVENTION

1. Field of the Invention

The present invention relates to the manufacture of semiconductor devices, more particularly, to a method to prevent undesirable shorts between metal lines during the manufacture process of dynamic random access memory (DRAM).

2. Description of the Related Art

Chemical mechanical polishing (CMP) has been widely used in the fabrication of semiconductor devices such as dynamic random access memory for planarization of the surface of a semiconductor wafer. A variety of chemical reagent (i.e. slurry) is generally utilized to planarize an uneven insulating layer comprising borophosphate silicate glass (BPSG) by the chemical mechanical polishing process. This CMP slurry has polishing particles with high hardness so that a scratch is easily generated on the surface of BPSG. A conformal silicon oxide layer deposited by the subsequent step may thus have a dent or recess, which can trap conductive material, on the scratch. As a result, the trapped conductive materials can cause undesirable shorts between adjacent metal lines.

SUMMARY OF THE INVENTION

In view of the above disadvantages, an object of the invention is to provide a method to prevent electrical shorts between adjacent metal lines without alternation of the contact resistance of metal lines.

Accordingly, the above object is attained by the present inventive process, performed upon a semiconductor substrate having an insulating layer with a pair of damascene structures connecting to the semiconductor substrate and a scratch on the upper surface between the damascene structures. A diffusion barrier layer is deposited on the damascene structures and the scratch. Then, a metal layer is formed to fill the damascene structures. Next, the metal is chemical-mechanically polished to form a metal line. Furthermore, the diffusion barrier layer disposed on the surface of the scratch is removed by etching.

In an embodiment of the invention, the insulating layer is preferably silicon oxide by tetra-ethyl-ortho-silicate (TEOS). Also, the diffusion barrier layer preferably comprises titanium nitride, tantalum nitride or titanium/titanium nitride. Furthermore, the metal layer is preferably tungsten.

Moreover, in another embodiment of the invention, etching is preferably performed by reactive ion etching using an etching gas containing chlorine.

Furthermore, in another embodiment of the invention, the diffusion layer preferably has an etching selectivity of about 6:1 and about 7:1 with respect to the metal layer.

BRIEF DESCRIPTION OF THE DRAWINGS

The preferred embodiment of the invention is hereinafter described with reference to the accompanying drawings in which:

FIG. 1 to FIG. 8 are cross-sections showing the process to prevent electrical shorts between adjacent metal lines during the fabrication of dynamic random access memory (DRAM), in accordance with the preferred embodiment of the invention.

DETAILED DESCRIPTION OF THE PREFERRED EMBODIMENTS

The following description explains the preferred embodiment of the invention, which proceeds with reference to the accompanying FIG. 1 to FIG. 8. These drawings are cross-sections showing the process to prevent electrical shorts between adjacent metal lines during the fabrication of dynamic random access memory (DRAM).

Figure 1:
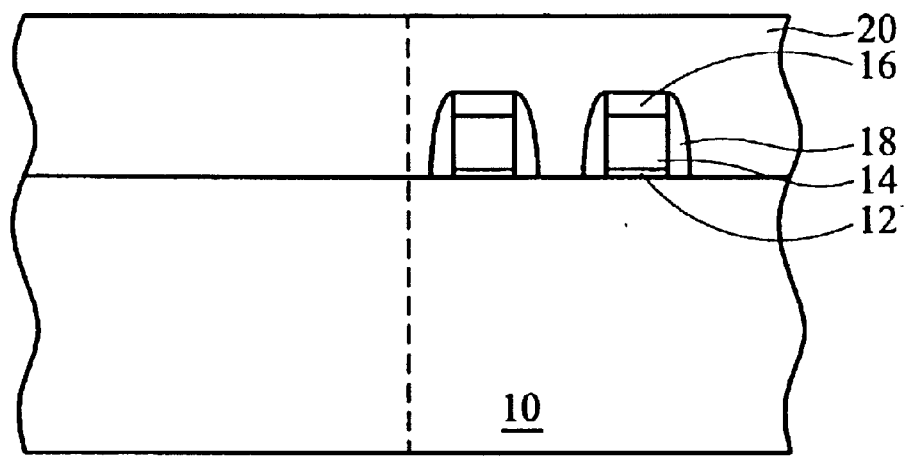
FIG. 1 to FIG. 8 are cross-sections showing the process to prevent electrical shorts between adjacent metal lines during the fabrication of dynamic random access memory (DRAM), in accordance with the prior art.

FIG. 1 shows a semiconductor substrate 10. A gate oxide 12, a gate electrode 14, an etching stop layer 16 made of silicon nitride and a silicon nitride spacer 18 are subsequently formed on the semiconductor substrate 10 by conventional process. Next, a first insulating layer 20 of borophosphosilicate glass (BPSG) is deposited by atmospheric pressure chemical vapor deposition (APCVD).

Figure 2:
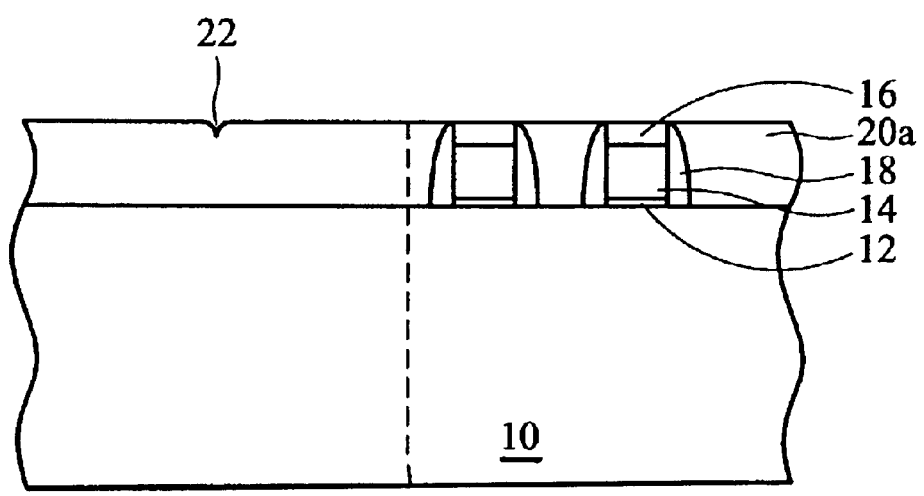

Next, referring to FIG. 2, the first insulating layer 20 of BPSG is polished by chemical mechanical polishing (CMP), using a suitable polishing condition and a slurry, until the etching stop layer 16 is exposed to leave an insulating layer 20a. A scratch 22 is generated at the upper surface of the insulating layer 20a because the slurry or the diamond dresser used in CMP.

Figure 3:
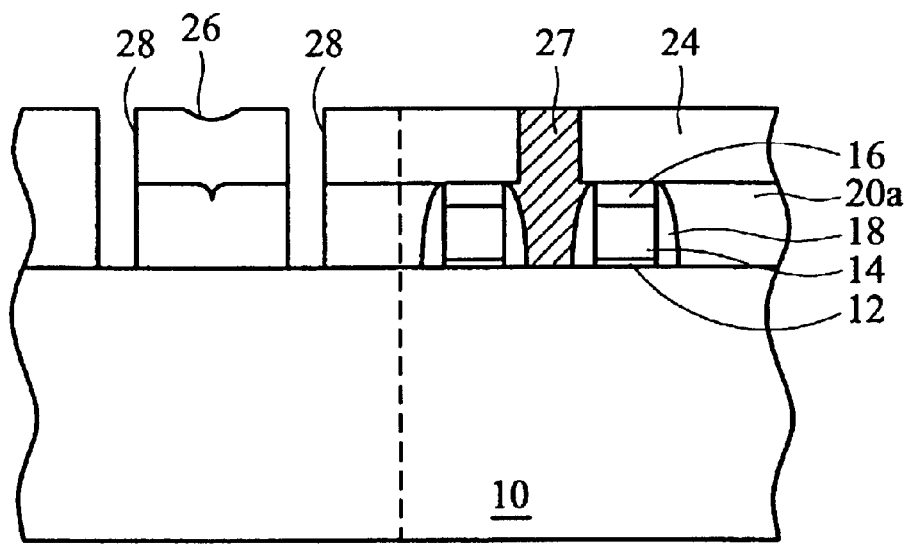

Afterward, referring to FIG. 3, a second insulating layer 24 made of silicon oxide is deposited over the first insulating layer 20a by TEOS-containing gas as the reactive gas. Due to the profile of the scratch 22, a recess 26 is generated at the position above the scratch 22. Next, a conductive plug 27 is formed to connect to the source/drain region (not shown) on the semiconductor substrate 10. Then, a contact hole 28 is defined at the predetermined position to contact the upper surface of the semiconductor substrate 10 by a series of conventional photolithography and etching.

Figure 4:
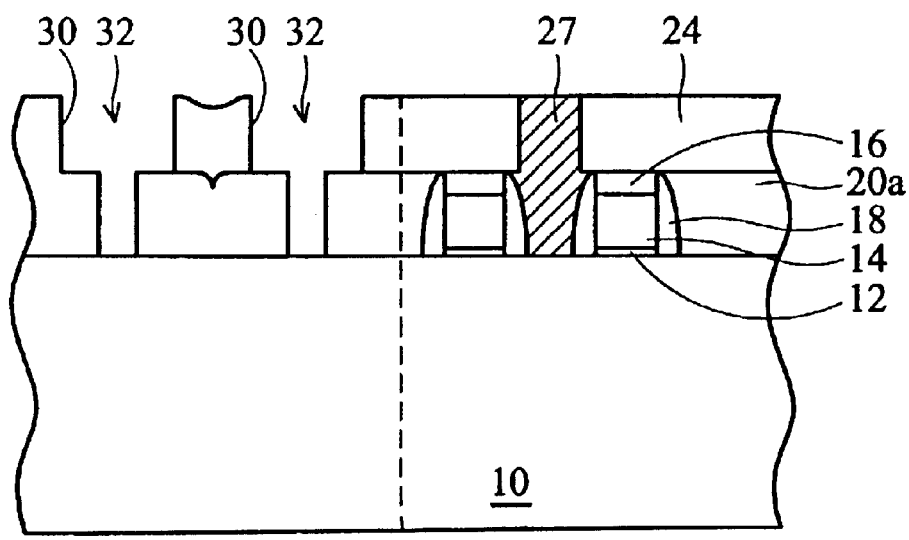

Referring to FIG. 4, a pair of trench 30 for metal lines is formed by a series of conventional photolithography and etching thus producing a pair of damascene structures 32 respectively including the trench 30 and the contact hole 28. Accordingly, the recess 26 is located between the damascene structures 32.

Figure 5:
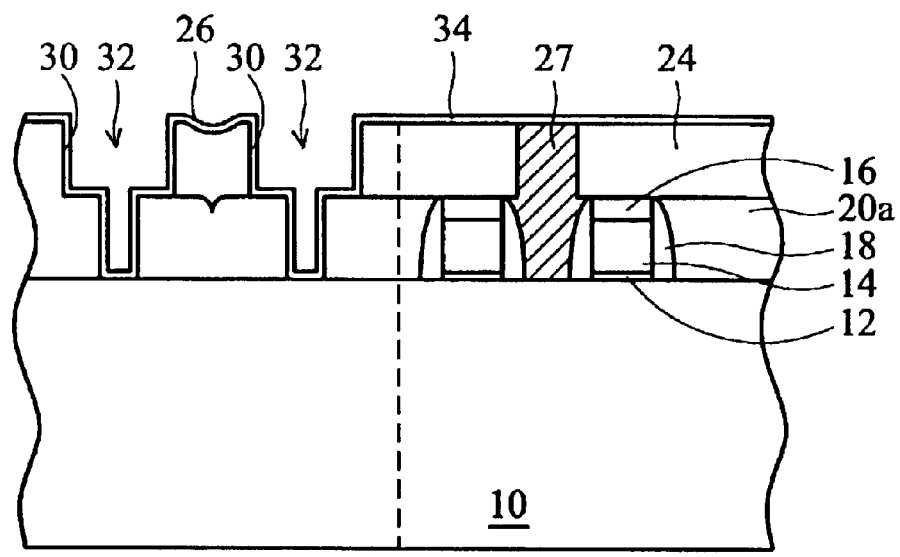

As shown in FIG. 5, a diffusion barrier layer 34, made of titanium nitride is deposited over the upper surface of the damascene structures 32 by chemical vapor deposition. Also, the diffusion barrier layer 34 is extended to the recess 26 located at the upper surface of the second insulating layer 24.

Figure 6:
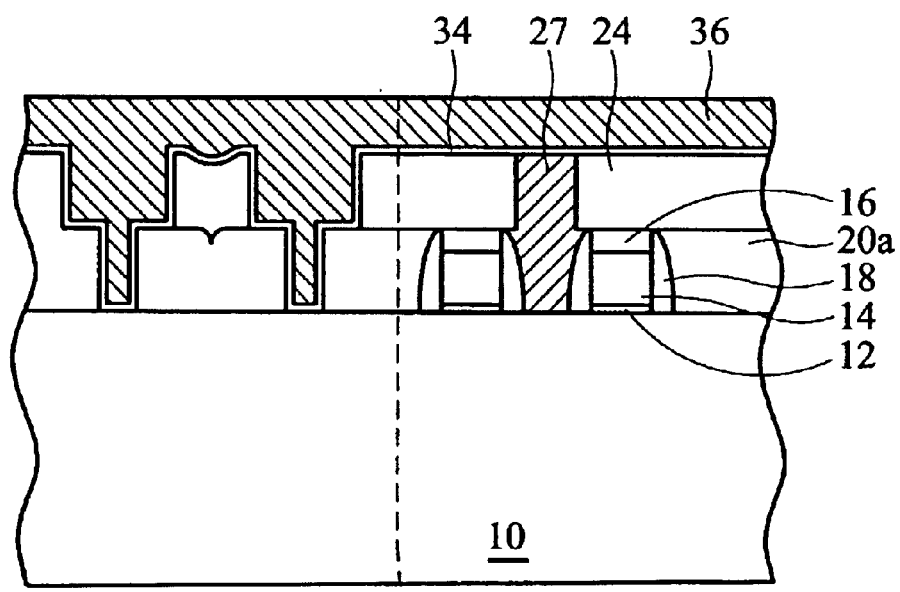
Figure 7:
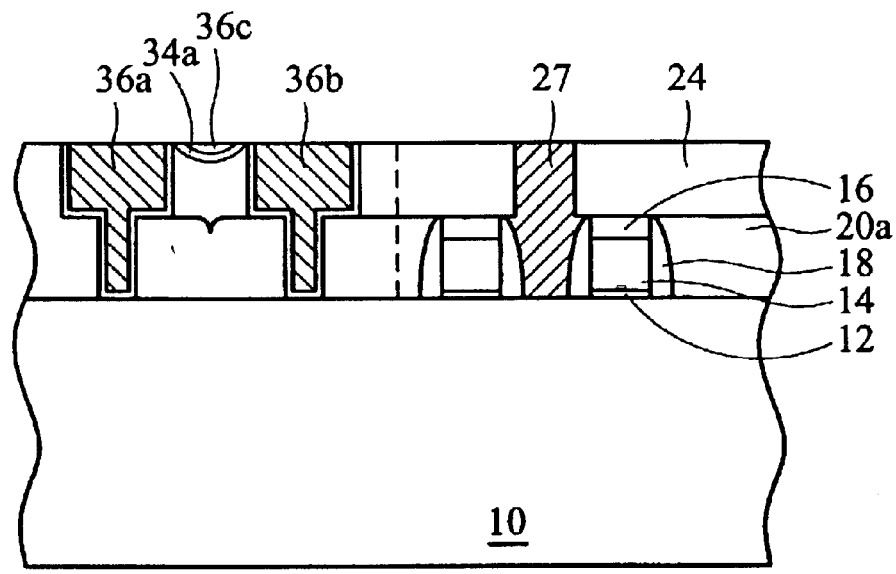

Furthermore, as shown in FIG. 6, a blanket tungsten layer 36 is entirely formed to fill the damascene structures 36 by chemical vapor deposition. Next, the blanket tungsten layer 36 and the diffusion barrier layer 34 are polished by chemical mechanical polishing until the second insulating layer 24 is exposed to form a metal line 36a and a metal line 36 as shown in FIG. 7. In this step, a diffusion barrier structure 34a and tungsten structure 34c are trapped in the recess 26 located at the surface of the second insulating layer 24. The diffusion barrier structure 34a and the tungsten structure 36c can easily result in electrical shorts between adjacent metal lines 36a and 36b.

Figure 8:
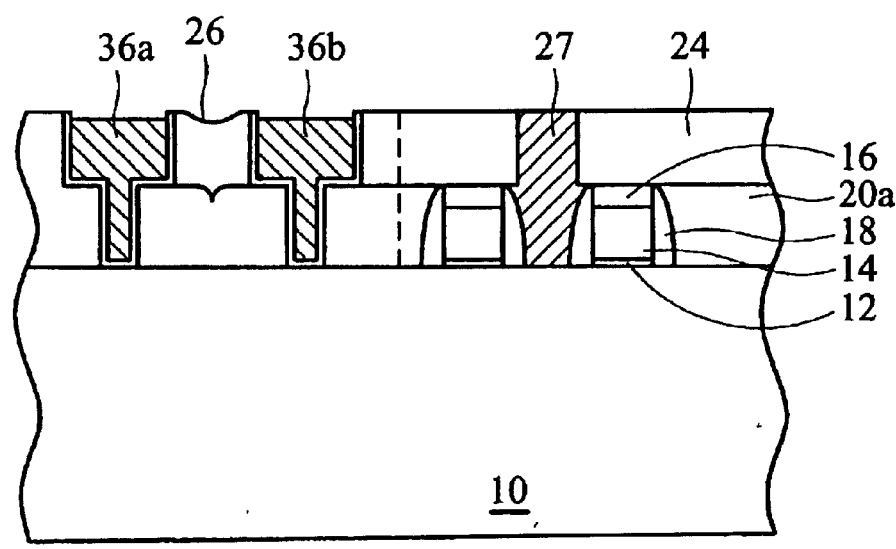
Figure 8:
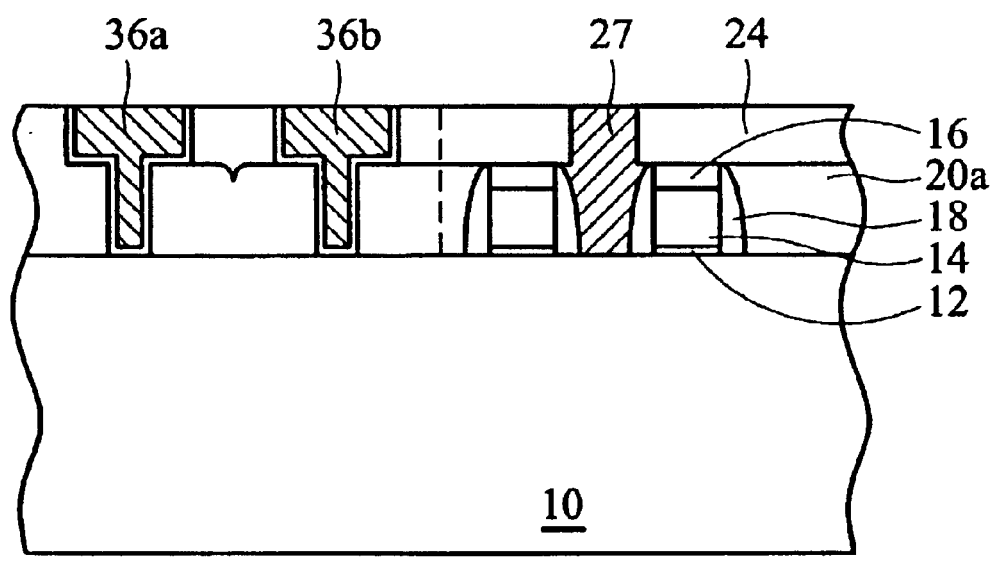

Next, as shown in FIG. 8, the diffusion barrier structure 3 and the tungsten structure 36c are etched by reactive ion etching using a reactive gas containing chlorine to have an etching selectivity of the titanium nitride/tungsten between 6:1 and 7:1 so that the diffusion barrier structure 34a and the tungsten structure 36c are removed.

THE COMPARISON EXAMPLE

The following description explains the prior art, which proceeds with reference to the accompanying FIG. 1 to FIG. 8. These drawings are cross-sections showing the process to prevent electrical shorts between adjacent metal lines during the fabrication of dynamic random access memory (DRAM).

As depicted in FIG. 1 to FIG. 7, the processes described as the preferred embodiment are conducted. Next, to prevent the undesirable shorts between adjacent metal lines 36a and 36b, the second insulating layer 24 is over polished to completely remove the diffusion barrier structure 34a and 36c. This can decrease the transfer speed of signals in dynamic random recess memory.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A method to prevent electrical shorts between adjacent metal lines, comprising the steps of:
   (a) providing a semiconductor substrate;
   (b) forming a gate oxide, a gate electrode and an etching stop layer, the etching stop layer being formed on the gate electrode;
   (c) forming a first insulating layer on the semiconductor substrate and the etching stop layer;
   (d) planarizing the first insulating layer until the etching stop layer is exposed;
   (e) forming a second insulating layer on the first insulating layer, wherein the second insulating layer has a recess portion;
   (f) selectively removing the second insulating layer and the first insulating layer to form a pair of dual damascene structures, the recess portion being located between the pair of dual damascene structures;
   (g) conformally forming a diffusion barrier layer on the second insulating layer and the recess portion;
   (h) forming a metal layer on the diffusion barrier layer to fill the pair of damascene structures;
   (i) chemical mechanical polishing the metal layer to form a metal line; and
   (l) removing the diffusion barrier layer disposed in the recess portion to expose the second insulating layer by etching.

2. A method to prevent electrical shorts between adjacent metal lines as claimed in claim 1, wherein the second insulating layer is silicon oxide deposited by tetra-ethyl-ortho-silicate (TEOS).

3. A method to prevent electrical shorts between adjacent metal lines as claimed in claim 1, wherein the diffusion barrier layer is a titanium nitride layer or a tantalum nitride layer.

4. A method to prevent electrical shorts between adjacent metal lines as claimed in claim 3, wherein the metal layer is a tungsten layer.

5. A method to prevent electrical shorts between adjacent metal lines as claimed in claim 1, wherein the etching process in step (l) is reactive ion etching (RIE).

6. A method to prevent electrical shorts between adjacent metal lines as claimed in claim 1, wherein the diffusion barrier layer has an etching selectivity of about 6:1 to about 7:1 with respect to the metal line.

7. A method to prevent electrical shorts between adjacent metal lines as claimed in claim 1, wherein the etching process in step (l) uses an etching gas containing chlorine.

* * * * *